United States Patent [19]

Khanna

[11] Patent Number: 5,037,720

[45] Date of Patent: Aug. 6, 1991

[54] HYDROXYLATED AROMATIC POLYAMIDE POLYMER CONTAINING BOUND NAPHTHOQUINONE DIAZIDE PHOTOSENSITIZER, METHOD OF MAKING AND USE

[75] Inventor: Dinesh N. Khanna, West Warwick, R.I.

[73] Assignee: Hoechst Celanese Corporation, Somerville, N.J.

[21] Appl. No.: 363,245

[22] Filed: Jun. 8, 1989

Related U.S. Application Data

[63] Continuation-in-part of Ser. No. 76,098, Jul. 21, 1987, Pat. No. 4,927,736, and a continuation-in-part of Ser. No. 915,342, Oct. 2, 1986, abandoned.

[51] Int. Cl.$^5$ .................. G03C 1/52; G03C 5/00
[52] U.S. Cl. .................. 430/190; 430/192; 430/168; 430/326; 430/330
[58] Field of Search .............. 430/190, 192, 326, 330, 430/168

[56] References Cited

U.S. PATENT DOCUMENTS

| | | | |
|---|---|---|---|
| 3,046,120 | 7/1962 | Schmidt et al. | 430/190 |
| 4,093,461 | 6/1978 | Loprest et al. | 430/326 |
| 4,339,521 | 7/1982 | Ahne et al. | 430/192 |
| 4,395,482 | 7/1983 | Ahne et al. | 430/192 |
| 4,529,682 | 7/1985 | Toukhy | 430/190 |
| 4,849,051 | 7/1989 | Ahne et al. | 430/283 |
| 4,880,722 | 11/1989 | Moreau | 430/190 |
| 4,927,736 | 5/1990 | Mueller et al. | 430/270 |

FOREIGN PATENT DOCUMENTS 2545697 4/1977 Fed. Rep. of Germany ...... 430/190

OTHER PUBLICATIONS

English language Abstract of European Publication #264,678, published 4/27/88 (Mueller et al.).

*Primary Examiner*—Charles L. Bowers, Jr.
*Assistant Examiner*—Christopher G. Young
*Attorney, Agent, or Firm*—James M. Hunter, Jr.

[57] ABSTRACT

A photosensitive alkali-soluble, thermally-stable fluorinated hydroxy-resinous polyamide or polyimide composition comprising a resin-bound diazo sensitizer incorporated by the reaction of an o-quinone diazide sulfonyl chloride sensitizer compound with a predetermined percentage of the hydroxy groups of the hydroxy-resin binder material. The present compositions are self-sensitized, have adjustable alkali-solubility and provide high speed photoresist compositions for producing relief patterns having good edge definition and high thermal stability.

4 Claims, No Drawings

HYDROXYLATED AROMATIC POLYAMIDE POLYMER CONTAINING BOUND NAPHTHOQUINONE DIAZIDE PHOTOSENSITIZER, METHOD OF MAKING AND USE

BACKGROUND OF THE INVENTION

This is a continuation-in-part of applications Ser. No. 76,098 filed July 21, 1987 now U.S. Pat. No. 4,927,736 issued May 22, 1990, and Ser. No. 915,342 filed Oct. 2, 1986 refiled as Ser. No. 526,583 pending.

The present invention relates to the production of novel photosensitive fluorinated polyimide and polyamide-resin binder materials containing resin-bound azo-sensitizers, and to photoresist compositions based upon such materials which are developable by means of conventional alkaline developer solutions, provide high resolution at relatively short exposure times and most preferably are thermally stable at relatively high temperatures.

Applications Ser. No. 76,098 and Ser. No. 915,342 relate to the production of novel fluorinated hydroxy polyimide and fluorinated hydroxy polyamide resin binder materials having hexafluoroisopropylidene linking groups, and their use in making base-developable, positive acting high speed photoresists for high temperature applications. The present invention relates to the modification of some of the same soluble hydroxy polyimide- and hydroxy polyamide-resin binder precursors disclosed in said applications, as well as other known soluble hydroxy-containing polyimide and polyamide resins, to produce soluble, self-sensitive photoresist materials and compositions incorporating such resin materials which are positive acting and base developable.

Generally, polyimide- and polyamide-photoresist compositions are available as high temperature-resistant resinous compositions which are soluble in conventional alkaline solvents and developers. This solubility is preserved in the positive photoresist process in which the exposed, uncoupled areas of the photoresist coating retain their original solubility while the unexposed masked areas are coupled with an azo photoinitiator to a condition in which they are rendered insoluble in alkaline developers. Reference is made to U.S. Pat. Nos. 4,093,461; 4,339,521 and 4,395,482 for their disclosure of such positive-acting photoresist compositions.

It also known that the presence of hydroxyl groups in such fluorinated polyimides and polyamides increases their solubility in various solvents including conventional aqueous alkaline developers. However this increased solubility creates a compatibility problem with respect to conventional diazo sensitizer compounds and/or with other materials present in the composition, such as other resin binder materials, having different degrees of solubility in the application solvent and/or in the alkaline developer. This leads to the application of non-uniform or non-homogeneous coatings having irregular photosensitivity and irregular development and a poor dark erosion rate.

In the industrial application of positive and negative resists, the polymeric component and the radiation sensitizer are dissolved in an organic solvent or mixture of solvents and applied as a thin film or coating to a substrate suitable for the desired application.

The polymeric component of these resist formulations is desirably soluble in aqueous alkaline solutions, but the sensitizer acts as a dissolution rate inhibitor with respect to the polymer. Upon exposure of selected areas of the coated substrate to actinic radiation, the sensitizer undergoes a radiation induced structural transformation and the exposed areas of the coating are rendered more soluble than the unexposed areas. This difference in solubility rates normally causes the exposed areas of the resist coating to be dissolved when the substrate is immersed in alkaline developing solution leaving the unexposed areas substantially intact, thus producing a positive relief pattern on the substrate.

In most applications, the exposed and developed substrate will be subjected to treatment by a substrate-etchant solution. The resist coating protects the coated areas of the substrate from the etchant and thus the etchant is only able to etch the uncoated areas of the substrate, which in the case of a positive resist, corresponds to the areas that were exposed to actinic radiation. Thus, an etched pattern can be created on the substrate which is a positive of the pattern of the mask, stencil, template, etc., that was used to create selective exposure patterns on the coated substrate prior to development.

The relief pattern of resist on the substrate produced by the methods described above is useful for various applications including, for example, as an exposure mask or a pattern such as is employed in the manufacture of miniaturized integrated electronic components or the manufacture of a printing plate.

The properties of a resist composition which are important in commercial practice include the solubility of the resist in the application solvent, the photospeed of the resist, development contrast, environmentally acceptable developer solubility, resist resolution, resist adhesion, dimensional stability at elevated temperature and abrasion resistance.

Photospeed is important for a resist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, high, controlled photospeed is particularly important for a resist composition employed in processes where a number of multiple exposures must be made to produce a mask or series of circuit patterns on a substrate. Control of the photospeed is extremely important in order to produce high resolution relief patterns in microcircuitry; e.g., a photospeed too high can result in narrowing the processing conditions.

Resist resolution refers to the capability of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a resist is required to provide a high degree of resolution for very small line and space widths (on the order of a micron or so).

The ability of a resist to reproduce very small dimensions, on the order of a micron or so, is extremely important in the production of large scale integrated circuits on silicon chips and similar components. Circuit density on such a chip can be increased, assuming photolithography techniques are utilized, by increasing the resolution capabilities of the resist.

Various attempts have been made in the prior art to produce high temperature positive resists possessing the above desired properties. For example, U.S. Pat. No. 4,093,461 discloses a heat resistant, positive resist composition comprising a quinone or naphthoquinone diazide and the polycondensation product of an aromatic dianhydride (pryomellitic anhydride) and an aromatic diamine (4,4'-diaminodiphenylether). The properties of the positive resist of the patent are discussed in U.S. Pat. No. 4,395,482 (column 1, lines 46-64). There it is pointed out that the positive resist composition of U.S. Pat. No. 4,093,461 has limited storage life, insufficient stability to alkaline etching solutions and relatively small differences in solubility between the exposed and unexposed portion of the resist.

To date, the use of imagable polyimide resist system has been limited by the lack of photospeed (slow photospeed), excessive volume contraction and by shelf life problems. The exceptional dielectric and high temperature resistance properties of polyimides made them particularly useful in the semiconductor industry. They can be used, for example, as dielectric layers, alpha particle barriers in memory devices, ion implantation masks and passivation layers. The goal of numerous development programs has been the development of a simple, reliable and cost effective radiation sensitive polyimide system that could be used with common photolithographic equipment and processes. This was the goal of by the work of R. Rubner et al. of Siemens Co. (R. Rubner, H. Ahne, E. Kuhn, G. Kolodziej; Phot. Sci. 4 Eng. 23(5), 303-309 (1979). H. Ahne, H. Kruger, E. Pammer and R. Rubner, "Polyimide Synthesis, Characterization and Application", K. L. Mittal ed., Vol. 2, 905-918, Plenum Press (1984). The basic systems in these publications consist of polyamic acid polymer bearing photoreactive side groups. To date, however, materials based on this chemistry have been plagued by poor shelf life, extraordinarily low photospeed and excessive post-development/post-cure structure contraction. Although materials based on this chemistry have yielded high resolution structures, they required exposures of ten minutes or longer. Shelf life was also notoriously short, particularly in highly concentrated solutions required for thick film applications and contraction of original structures upon cure was as much as 60 percent.

The present invention uses the novel fluorinated hydroxy polyimides and fluorinated hydroxy polyamides of the aforementioned parent applications as a binder material to provide positive photoresist compositions e.g., an alkali soluble fluorinated hydroxy polyimide or fluorinated hydroxy polyamide having a resin-bound azo sensitizer to provide high temperature-resistant, unitary, self-photosensitive resins having adjustable base solubilities, such as for photoresist protective coatings, and having good shelf life, rapid development and cure properties and high dimensional stability, for producing uniform patterns with excellent resolution and adhesion properties.

SUMMARY OF THE INVENTION

The present invention is based upon the discovery that the novel alkali-soluble fluorinated hydroxy-containing polyimides and polyamides of the aforementioned copending applications can be reacted with light sensitive hydroxyl-reactive azo photosensitizers to produce positive-acting photosensitive compositions having variable solubility, after exposure to radiation, in conventional alkaline developers.

According to the present invention, the developer solubility of the polyimide or polyamide is reduced by neutralizing the solubilizing effect of the hydroxy groups in the preformed polymer by reacting a predetermined percentage of them with a hydroxy-reactive azo sensitizer compound to form a self-photosensitive homogeneous resin having the desired lithographic properties. Such post-polymerization neutralization of a percentage of the hydroxy groups also provides a method of controlling the resist's photospeed.

The hydroxy polyimides useful for modification according the the present invention are typically prepared, for example, by the solution condensation of hexafluoro-2,2-bis-(3-amino-4- hydroxyphenyl) propane with a dianhydride such as 5,5'[2,2,2-trifluoro-1-(trifluoromethyl)ethylidene]bis-1,3-isobenzofurandione, benzophenone tetracarboxylic dianhydride (BTDA), and oxydiphthalic dianhydride (ODPA), as disclosed more completely in copending application Ser. No. 76,098, the disclosure which is hereby incorporated by reference. The polyimides to be modified according to the present invention have the general structure (1):

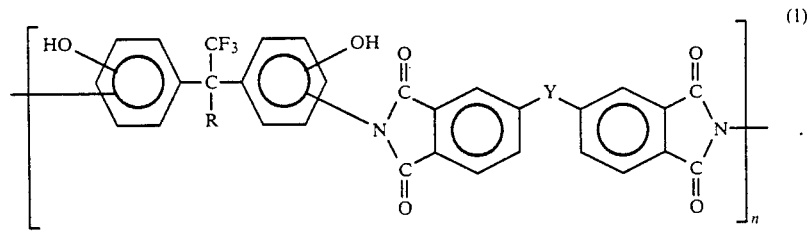

where "Y" is S, SO$_2$, direct link, 0, CF$_3$-C-R or C=0 and "R" is CF$_3$ or phenyl, and "n" is a number sufficiently high to provide an inherent viscosity of at least about 0.2 as measured from a 0.5 wt % solution in dimethylacetamide at 25° C.

The hydroxy polyamides useful for modification according to the present invention are prepared, for example, by reacting an acid chloride with hexafluoro-2,2-bis (3-amino-4-hydroxyphenyl) propane. The diamine is used in an amount of from about 20 to 100 mole percent, preferably about 50 mole percent and most preferably about 70 to 100 mole percent of the diamine components present in the polymer, as disclosed more completely in copending application, Ser. No. 915,342, the disclosure of which is hereby incorporated herein by reference thereto.

The polyamides to be modified according to the present invention have the general structure (2):

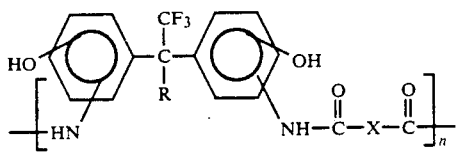

(2)

where "X" is S, SO₂, direct link, phenyl,

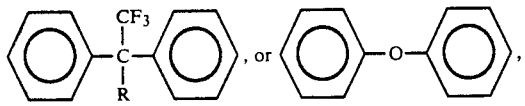

and "R" is CF₃ or phenyl, and "n" is as defined for structure (1).

The essence of the present invention resides in the discovery that the present alkali-soluble fluorinated, hydroxylated polyamide or polyimide binder materials can be reacted with hydroxy-reactive photosensitive azo compounds to provide self-photosensitive, alkali-insoluble coatings having good shelf life and variable predetermined solubility properties and which develop variable predetermined degrees of alkali-solubility upon exposure to actinic radiation including ultraviolet but which retain their low solubility or insolubility in alkaline developers in unexposed areas. After exposure the irradiated areas of the coating can be developed with conventional alkaline developers in a few minutes to provide positive images having a minimum line width of about 4 microns, the image pattern being thermally stable at 300° C. and evidencing no blurring after heating to a temperature of 300° C. for one hour.

DETAILED DESCRIPTION OF PREFERRED EMBODIMENTS

The novel positive-acting, alkali-developable photoresist compositions of the present invention comprise the reaction product of a normally alkali-soluble hydroxy polyimide of the structure (1), and/or of an alkali-soluble hydroxy polyamide of the structure (2) with a hydroxy-reactive photosensitizer, such as o-quinone diazide sulfonylchloride, to produce a self-photosentized resin having a predetermined reduced degree of solubility in conventional alkaline developers until exposed to actinic reaction.

A preferred polyimide for modification according to the present invention is one produced by reacting hexafluoro-2,2-bis (3-amino-4-hydroxyphenyl) propane, which is known in the art as 6-F aminophenol, with 5,5'-[2,2,2-trifluoro-1-(trifluoromethyl)ethylidene] bis-1,3-isofurandione (2,2-bis-(3,4-dicarboxyphenylhexafluoropropane dianhydride. Such polyimide has the structure (1) in which Y is

and is produced according to Example of aforementioned application Ser. No. 76,098.

A preferred polyamide for modification according to the present invention is one produced by reacting the same 6-F aminophenol with a 50/50 mixture of isophthaloyl chloride and terephthaloyl chloride, according to Example 1 of aforementioned application Ser. No. 915,342. The polyamide has the structure (2) in which Y is an equal molar mixture of isophthaloyl and terephthaloyl radicals and "n" is approximately 200.

The preferred modified polyimide and polyamide resins produced according to the present invention have the following approximate structures 3 and 4:

(3) 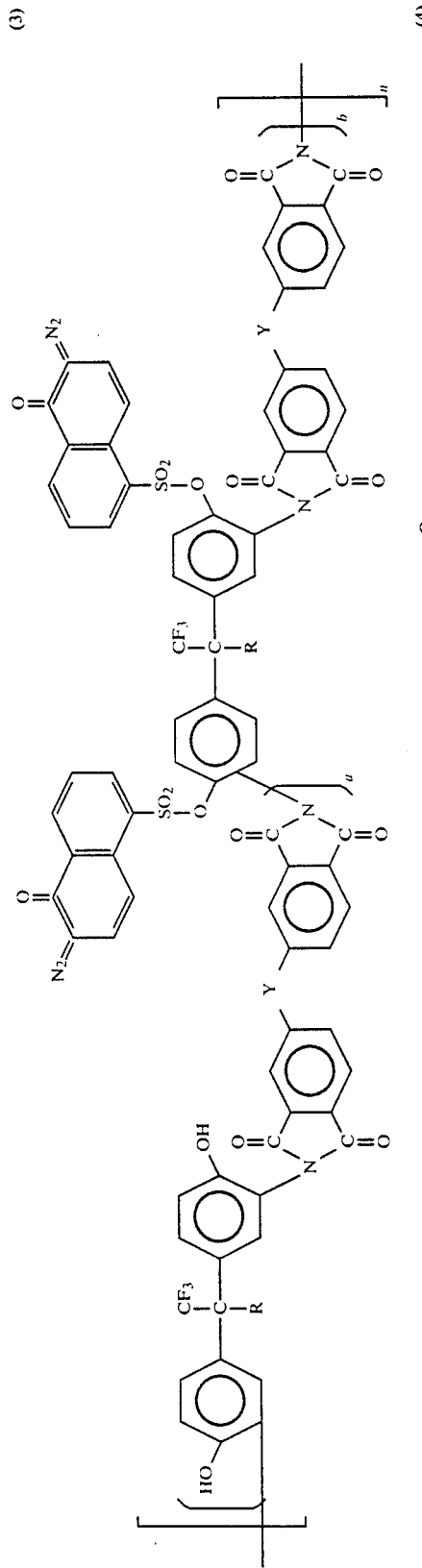
(4) 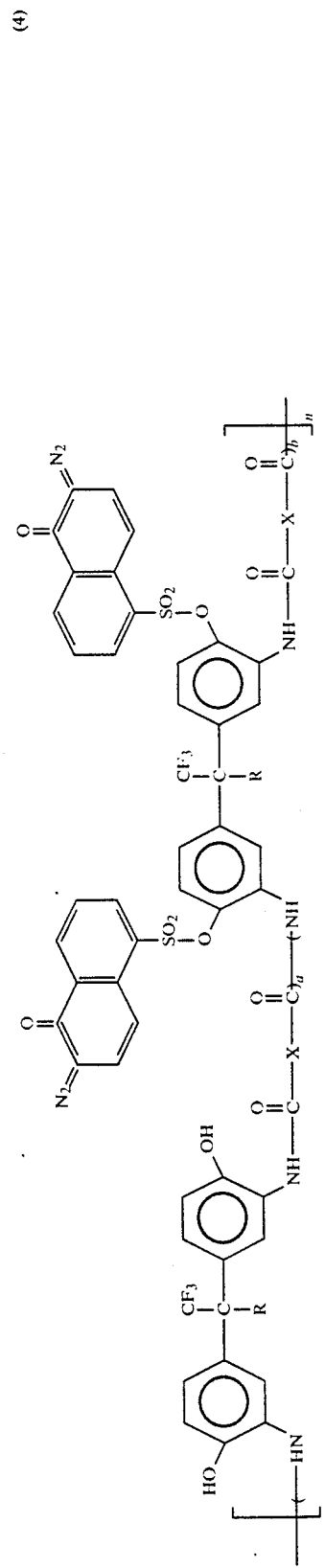

wherein X, Y and n are as indicated in structures 1 and 2, and the ratio of a to b ranges between about 1:1 and 10:1 and most preferably between about 3:1 and 5:1. Thus at least about 10% and up to about 50% of the total number of hydroxyl groups in the original resin are reacted and blocked by the sensitizer moiety, thereby producing sensitizer-bound resins which are insoluble in alkaline developers until exposed to actinic radiation. Moreover, the alkali solubility of the exposed resins is reduced to the predetermined degree in order to reduce background or dark film loss and produce sharper edge definition and reduced line widths. Thus, by varying the molar proportions of the sensitizer reacted with the hydroxy resin, the desired percentage of hydroxy groups i.e., 10% up to 50% thereof, can be blocked by reaction with the sensitizer, thereby providing the desired degree of solubility of the exposed resin in conventional alkaline developers.

Conventional o-quinone diazide sulfonyl chloride, photosensitizers are useful for reaction with the present hydroxy resins, including the o-quinone diazides well known in the photoresist art as disclosed in *Light Sensitive Systems,* Kosar, J.: John Wiley & Sons, N.Y., 965 in Chapter 7.4 which is also incorporated herein by reference. These sensitizers are selected from the group of substituted naphthoquinone and benzoquinone diazide sensitizers which are conventionally used in the art in positive photoresist formulations. Such sensitizing compounds are disclosed, for example in U.S. Pat. Nos. 2,797,213; 3,106,465; 3,148,983; 130,047; 3,201,329; 3,785,825; and 3,802,885. preferred photosensitizers are naphthoquinone-(1,2)-diazide-5-sulfonyl chloride, naphthoquinone-(1,2)-diazide-4-sulfonyl chloride, and mixtures thereof.

Additives such as colorants, dyes, anti-striation agents, plasticizers, adhesion promoters, speed enhancers, solvents and such surfactants as non-ionic surfactants may be added to the solution of the sensitizer-bound resin and solvent before the solution is coated onto a substrate.

Examples of dye additives that may be used together with the photoresist compositions of the present invention include Methyl Violet 2B (C.I. No. 42000), Victoria Blue B (C.I. 44045) and Neutral Red (C.I. No. 50040) at one to ten percent weight based on the combined weight of polyamide and sensitizer. The dye additives help provide increased resolution by inhibiting back scattering of light off the substrate.

Anti-striation agents may be used up to five percent weight level, based on the combined weight of polyamide and sensitizer.

Adhesion promoters which may be used include, for example, beta-(3,4-epoxy-cyclohexyl)-ethyltrimethoxysilane; p-methyl-disilane-methyl methacrylate; vinyltrichlorosilane; and y-amino-propyl triethoxysilane up to a 4 percent weight level, based on the weight of the sentizer-bound resins.

Speed enhancers that may be used include, for example, picric acid, nicotinic acid or nitrocinnamic acid at a weight level of up to 20 percent, based on the weight of the sensitizer-bound resin. These enhancers tend to increase the solubility of the photoresist coating in the exposed areas, and thus they are used in applications when speed of development is the overriding consideration. While the exposed areas of the photoresist coating will be dissolved more quickly by the developer, the speed enhancers will not cause a loss of the photoresist coating from the unexposed areas because of the reduced solubility of the resin in the developer.

Typical commercial organic solvents employed in the art may be used for preparing the resist compositions of this invention. The amount of solvent used in the preparation of the resist solution may range up to about 95% by weight of the solution. Typical useful solvents are N-methylpyrrolidone, dimethylacetamide, propylene glycol methyl ether acetate, methylethyl ketone, cyclohexanone, cyclopentanone, butyrolactone and mixtures thereof; preferred solvents are N-methylpyrrolidone, propylene glycol methyl ether acetate, and cyclopentanone.

The prepared resist solution, can be applied to a substrate by any conventional method used in the photoresist art, including dipping, spraying, whirling and spin coating. When spin coating, for example, the resist solution can be adjusted as to the percentage of solids content in order to provide a coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide substrate can be used as well. The substrate may also comprise various polymeric resins especially transparent polymers such as polyesters.

Suitable developing solutions for the radiation sensitive compositions of the present invention are aqueous solutions of inorganic alkaline compounds such as those of sodium silicate, potassium silicate, sodium hydroxide, potassium hydroxide, lithium hydroxide, sodium phosphate, sodium monohydrogen phosphate, ammonium phosphate, ammonium monohydrogen phosphate, sodium metasilicate, sodium bicarbonate, ammonia, etc., with a suitable concentration of these compounds being between about 0.1 about 10%, more preferably between 0.5 and 5%, by weight. Specific examples of developer solutions are disclosed in U.S. Pat. Nos. 3,110,596; 3,173,788 and 3,586,504 for example.

Such an alkaline solution can also contain certain organic solvents such as alcohols (e.g., methanol, ethanol, benzyl alcohol, etc.) as well as a surface active agent (e.g., sodium alkylnaphthalene solfonate, sodium lauryl sulfate, etc.) depending on the requirements.

After the resist composition solution is coated onto the substrate, the substrate is baked at approximately 80° to 105° C., preferably at about 90° C. for a few minutes until substantially all the solvent has evaporated and only a thin coating of photoresist composition on the order of a micron in thickness remains on the substrate. The coated substrate can then be exposed to actinic radiation in any desired exposure pattern, produced by use of suitable masks, negatives, stencils, templates, etc.

The exposed resist-coated substrates are next substantially immersed in alkaline developing solution. The solution is preferably agitated, for example, by nitrogen burst agitation.

The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. In fact, the resist formulations of the present invention have excellent adhesion to substrates such as silicon wafers, aluminum plates, glass, polyester films etc. No adhesion promoter was necessary for the photoresist processing. The post-development heat treatment can comprise the oven baking of the coating and substrate below the coating's softening point, at a temperature from about 80°–375° C., preferably at 225°–350° C. The heat treatment time ranges from 0.5 to about 2.0 hours. Typically, the glass transition temperature (Tg) of the polyamide prior to heat treatment is in the order of about 250° C.–300° C. and, after heat treatment and conversion to a polyoxazole structure, is between about 300°–350° C., typically about 305° C.–325° C.

After curing the developed substrate may be treated with a buffered hydrofluoric acid or alkaline etching solution. The resist compositions of the invention are resistant to both acid and base etching solutions and provide effective protection for the unexposed resist-coated areas of the substrate. The developed, cured photoresist provides relief structures of excellent resolution and high thermal stability.

Although the above description is in terms of a wet-etching process, the relief patterns of the invention may be used in both wet and dry etching processes. The resulting structures are particularly useful insulating layers in microcircuitry applications, as masks in vapor depositions processes, ion implantation processes, etc. Similarly, the photoresists of this invention may be used in the preparation of printing plates, lithographic proofing applications, lithographic transfer foils and other similar applications. The preparation of printing plates using positive photoresists is well known in the art as illustrated by U.S. Pat. No. 3,493,371, the teachings of which are incorporated by reference.

The following specific examples will provide detailed illustrations of the methods of producing and utilizing compositions of the present invention. These examples are not intended, however, to limit or restrict the scope of the invention in any way and should not be construed as providing conditions, parameters of values which must be utilized exclusively in order to practice the present invention.

EXAMPLE 1

The polyamide of the following formula was synthesized by the solution polycondensation method:

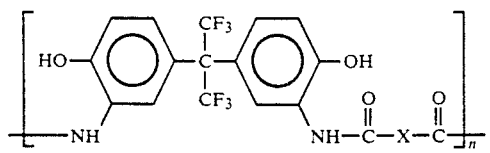

where X=50/50 equal molar mixture of isophthaloyl/-terephthaloyl radicals and n is approximately 200.

To a solution of hexafluoro-2,2-bis (3-amino-4-hydroxyphenyl)propane (0.01 mole=3.66 gm) in dimethyl acetamide (16.5 ml) and pyridine (3 ml) was added a 50/50 mixture of isophthaloyl chloride and terephthaloyl chloride (0.0055 moles isophthaloyl chloride=1.1165 gm) and (0.0055 moles terephthaloyl=1.1165 gm) in cyclohexanone (6.5 ml) dropwise with rapid stirring at −10° to −15° C. for 30 min. After stirring overnight (24 hrs) at room temperature, the resulting solution was poured into an ice water mixture to precipitate the polymer. The polyamide was filtered, washed with water, and dried under vacuum at 90 overnight.

The yield was almost quantitative and the inherent viscosity of the polymer was 0.40 dlg$^{-1}$ in dimethyl acetamide (0.5% conc. 25° C.

The modified polyamide-bound sensitizer resin of the general structure (4) was prepared by dissolving 4.96 grams (0.01 mole) of the above hydroxy polyamide and 1.0748 grams (0.004 mole) of naphthoquinone -(1,2)-diazide- 5-sulfonyl chloride (DLSC) in 11 ml of N-methyl pyrrolidone and 11 ml of acetone in a 100 ml round bottom three-neck flask having a magnetic stirrer and thermometer. After dissolution the solution has a clear orange color. Add 0.66 gram of N-methyl morpholine, dissolved in 4 ml N-methyl pyrrolidone, dropwise to the reaction mixture over a period of 30 minutes, then add 1.5 ml glacial acetic acid for neutralization.

Into a beaker charge 700 ml 1.N hydrochloric acid and add thereto, dropwise, the reaction mixture from the flask. A precipitate occurs immediately. Stir with vigorous agitation and rinse with water, dry in a vacuum at 45° C. overnight. The yield is 5.3 grams of resin having the structure (4) in which X is as indicated above, the ratio of a:b is 5:1 and n is approximately 200.

The bleaching characteristic of the polyamide-bound sensitizer resin was determined by dissolving 5% of the resin in a mixture of polyethylene glycol methyl ether and N-methyl pyrrolidone, coating the solution on thick white paper board and gently baking the coating at 90° C. for three minutes. The coating took on a deep yellow color. Half of the coating was covered or masked by an aluminum sheet and the coating was exposed to UV light 365 nm) for 60 seconds. The light-exposed area of the coating developed a light brown color in contrast to the unexposed area which remained yellow. The bleaching characteristic, indicated by the change in optical density during exposure, renders the coating suitable for photosensitive applications.

EXAMPLE 2

This example illustrates the preparation of a modified hydroxy polyimide having the following recurring structure:

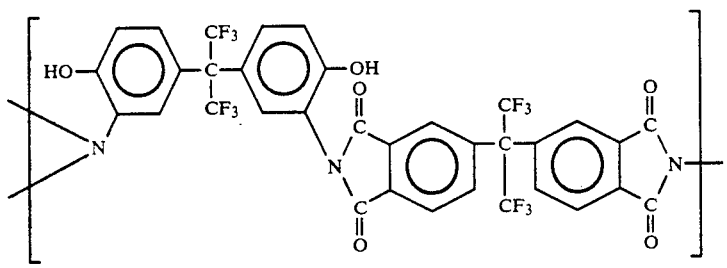

In a four necked 500 ml flask equipped with a thermometer, a condenser, a dean-stark trap, mechanical stirred and a nitrogen inlet tube, 7.32 gm (0.02 moles) of hexafluoro-2,2-bis(3-amino-4-hydroxyphenyl) propane (6F-aminophenol) was charged under a nitrogen atmosphere along with 128 ml monochlorobenzene (MCB) (80%), and 32.0 ml of N-methylpyrrolidone (NMP) (20%). The mixture was stirred until a clear solution was obtained and 8.88 gm (0.02 mole) of 5,5'-[2,2,2-trifluoro-1-(trifluoromethyl) ethyliden]bis-1,3-isobenzofurandione (2,2-bis-(2,4-dicarboxy-phenyl-hexafluoropropane dianhydride) was added. The contents of the flask were heated to 90° C. and 0.04 gm. para-toluene solfonic acid (PTSA) was added. The contents were then heated at a reflux temperature (about 142° C.). In first hour about 100 ml of the water-chlorobenzene azeotrope was separated in the dean-stark trap. Fresh 100 ml chlorobenzene was added to the flask and the contents were refluxed for 10 hours at 142°-145° C.

100 ml of NMP was then added and the mono-chlorobenzene was distilled off at 160–165° C. The reaction mixture was cooled and slowly precipitated in an ice-water-methanol mixture. A white precipitate resulted which was washed thoroughly with hot water and the polymer was dried overnight in vacuum oven at 124° C.

The polymer had inherent viscosity of 0.50 dl/g in dimethylacetamide at 25° C. and was soluble in common organic solvents such as N-methylpyrrolidone, dimethylacetamide, tetrahydrofurane, diemethylene glycol methyl ether, propylene glycol methyl ether (PGME) and methyl cellosolve. The glass transition temperature (Tg) of the polymer as determined by differential scanning calorimetry was 306° C.

The polyimide-bound sensitizer resin having the structure (3), in which Y is a 1,3 trifluoro isopropylidene group, was produced in the same manner as the polyamide-bound sensitizer resin of Example 1.

EXAMPLE 3

A photosensitive composition was prepared by dissolving 16% by weight of 6-F polyamide resin, such as one prepared according to Example 1 and having 20% of the hydroxyl groups esterified by reaction with a sensitizer such as DLSC, in 84% by weight of a solvent mixture comprising 4 parts by weight of polyethylene glycol methyl ether acetate (PGMEA) and 1 part by weight gamma butyrolactone to form a clear solution. The solution was filtered through a pressure funnel using a 0.45 μm polytetrafluoro ethylene membrane filter.

The resulting solution was spin coated onto 3" silicon wafers at 1500 RPM to produce resist films having thicknesses of about 1.0 μm. The coated wafers were soft baked at 90° C. for 30 minutes and then exposed to broad band radiation of about 150 millijoules through an optoline mask. The intensity was measured at 405 nm.

The exposed resist layers were developed for 20 seconds using an aqueous base developer comprising a 1:4 solution of AZ developer in water. Fine resolution positive tone relief images were obtained having well defined line spaces of 2 μm The sensitivity or photospeed is about 30 millijoules per square centimeter (20% clear) and the dark film loss is about 660 angstroms. The formed pattern is stable above 300° C. after thermal cyclization of the resist into polybenzoxazole.

EXAMPLE 4

The procedure of Example 3 was repeated in exact manner except that the 6-F polyamide resin used is one in which 30% of the hydroxyl groups are esterified with the sensitizer.

The same excellent results were obtained with respect to well resolved positive tone fine line relief images having 2 μm line spaces and thermal stability above about 300° C. However the sensitivity or photospeed increased to about 150 millijoules and the dark film loss was about 230 angstroms.

A comparison of the 20% ester of Example 3 with the 30% ester of Example 4 and with an identical hydroxy polyamide containing 50% esterification, i.e., 50% of the hydroxyl groups reacted with the DLSC sensitizer to bind a larger amount of the sensitizer to the polymer, shows that the inherent viscosity of the polymer is lowered with the increased esterification, as is its base solubility and dark film loss, i.e., solubility in the unexposed regions. The 20% and 30% esters are ideal for making a photoresist, while the 50% esters have very limited aqueous base solubility.

EXAMPLE 5

The 2,1,4-diazo ester of the hydroxy 6-F polyamide polymer of Example 1 is prepared by dissolving 37.2 gm (0.075 mol) of the hydroxy polyamide polymer and 8.061 gm (0.03 mol - for capping two hydroxy groups per repeat unit of naphthoquinone -1,2-diazide-4-sulfonyl chloride (DFSC) in 250 ml acetone and 50 ml N-methyl pyrrolidone (NMP) in a 500 ml round bottomed flask having an overhead stirrer and thermometer. The temperature was maintained at 25° C. and the ingredients were dissolved to form a clear amber solution.

A solution of 4.95 gm of N-methyl morpholine dissolved in 37.5 ml of acetone was added dropwise to the reaction mixture in the flask over a period of about 30 minutes. Then 11.3 ml of acetic acid was added for neutralization and the reaction mixture was stirred for about one hour and then precipitated into an 8:1 mixture of deionized water and methanol. A precipitate occurs immediately, which was vigorously agitated, rinsed with water and dried in vacuum at 45° C. The yield of the 20% ester is 40.6 gm (92%).

EXAMPLE 6

Twenty percent by weight of the resin bound sensitizer polyamide of Example 5 (20% 2,1,4-diazo ester) was dissolved in a 1:1 mixture of PGMEA and gamma butyrolacetone, coated onto 3" silicon wafers at 2000 RPM and soft baked at 90° C. for 30 minutes to form resist coatings about 1.2 um in thickness.

The resist coatings were exposed through an optoline mask to 405 nm intensity ultraviolet radiation on a broad band UV exposure unit, and then developed for 60 seconds in a 1:4 solution of AZ developer in water. Fine resolution positive tone relief images were obtained, with 2 μm line/space patterns. The photospeed was about 37.5 millijoules/cm$^2$ and the dark film loss was about 1800 angstroms. The image patterns are stable at above about 300° C. after thermal cyclization of the resist into polybenzoxazole.

EXAMPLE 7

A photoresist solution was prepared by dissolving 0.5 gram of the polyamide-bound sensitizer resin of Example 1 and 0.02 gram of red dye in 5 ml of methylethyl ketone. The solution is filtered and then roller coated on an anodized aluminum plate. After drying for 5 minutes at 100° C. a resist film having the thickness of 2-3 um was obtained. This film is covered with a photomask having a striped pattern so that the film and the photomask are in tight contact. The UV light is irradiated thereon for 60 seconds by the use of mercury vapor lamp of 200 W. The intensity of the UV light at the film surface is 4 mw/cm$^2$ at a wavelength of 365 nm. After the irradiation, the coating was developed using 1:3 alkaline developer (AZ Developer) :water mixture. The developed plate is washed with water to obtain a fine, uniform relief pattern having sharp lines and edges. The developed plate is then given a post-development heat treatment at 250° C. for 1 hour.

The pattern obtained showed no blurring or loss of resolution after heating for up to 6 hours at a temperature of 250° C. The thermally-treated images are resistant to acid, base and solvents.

EXAMPLE 8

A photoresist solution can be prepared by dissolving 10.5 parts of hydroxy modified polyimide of Example 2 and 0.08 parts by weight of red dye in 10 parts by weight of N-methylpyrrolidone and 10.0 parts by weight of propylene glycol methyl ether. The solution is filtered and then roller coated on an anodized aluminum plate. After drying for 30 minutes at 90° C., a resist film having a thickness 2-3 μm will be obtained. This film is covered with a photomask having a striped pattern so that the film and the photomask are in tight contact. Then UV light is irradiated thereon for 60 seconds using a 200 W mercury vapor lamp. The intensity of the UV light at the film surface is 5 mw/cm$^2$ at a wavelength of 365 nm. After the irradiation, the coating is developed using 1:3 alkaline developer (AZ Developer) :water mixture. The developed plate is washed with water to obtain a fine, uniform relief pattern having sharp lines and edges.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

What is claimed is:

1. In a photosensitive composition comprising a hydroxylated aromatic polyamide polymer normally having a large number of free hydroxyl groups and a high degree of solubility in aqueous alkaline developer solvents, the improvement which comprises such a polymer in which less than about 50% of the hydroxyl groups of said polymer are reacted with a naphthoquinone - (1.2) - diazide - sulfonyl chloride photosensitizer to bind the photosensitizer to the polymer and form a unitary photosensitive polyamide polymer having a predetermined low degree of solubility in aqueous alkaline developer solvents in unexposed areas, providing reduced dark film loss and increased resolution, a predetermined degree of photosensitivity, and a predetermined moderate degree of solubility in alkaline developer solvents in areas exposure to ultraviolet radiation, wherein said hydroxylated, polymer comprises a hydroxylated polyamide which, prior to reaction with the said photosensitizer, has the general structure:

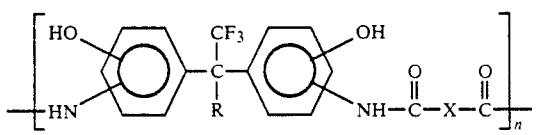

wherein X is S, SO$_2$, direct link, phenyl,

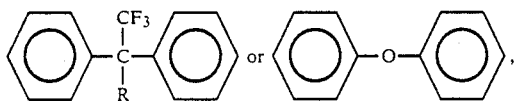

and R is —CF, or phenyl, and n is a number sufficiently high to provide an inherent viscosity of at least about 0.2 as measured from a 0.5 wt % solution in dimethylacetamide at 25° C., and said reaction product thereof has the general structure:

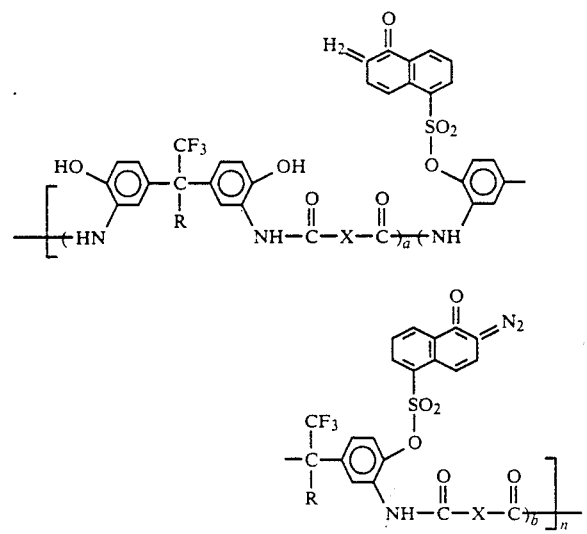

where X, R and n are as defined above, and the ratio of a to b ranges between 3:1 and 5:1.

2. A photosensitive composition according to claim 1 in which said hydroxylated polyamide comprises a plurality of fluorinated alkyl linking groups whereby said polymer has high thermal resistance properties.

3. A process for producing unitary photosensitive compositions comprising hydroxylated aromatic polyamides having a predetermined low degree of solubility in aqueous alkaline developer solvents in unexposed areas providing reduced dark film less and increased resolution, a predetermined degree of photosensitivity and a predetermined moderate degree of solubility in alkaline developer solvents in areas exposed to ultraviolet radiation, which comprises reacting a non-photosensitive hydroxylated aromatic polyamide polymer normally having a large number of free hydroxyl groups and a high degree of solubility in alkaline developer solvents with a predetermined amount of a naphthoquinone - (1.2) - diazide - sulfonyl chloride photosensitizer in order to bind the photosensitizer to less than about 50% of the hydroxyl groups present in the polyamide polymer and render the polymer photosensitive, and less soluble in aqueous alkaline developer solvents in unexposed areas after exposure to ultraviolet radiation, thereby providing reduced dark film less and increased resolution, wherein said hydroxylated polymer comprises a hydroxylated polaymide which, prior to reaction with the said photosensitizer, has the general structure:

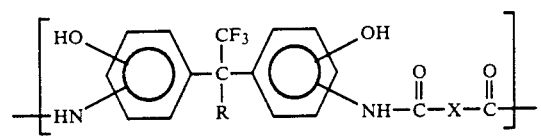

wherein X is S, SO$_2$, direct link, phenyl,

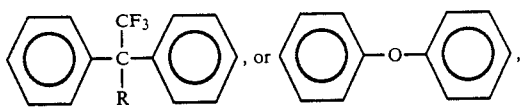

and R is CF$_3$ or phenyl, and n is a number sufficiently high to provide an inherent viscosity of at least about 0.2 as measured from a 0.5 wt % solution in dimethylacetamide at 25° C., and said reaction product thereof has the general structure:

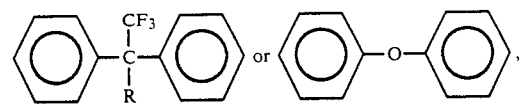

wherein X, R and n are as defined herein above, and the ratio of a to b ranges between 3:1 and 5:1.

4. A process according to claim 3 in which said hydroxylated polyamide comprises a plurality of fluorinated alkyl linking groups whereby said polymer has high thermal resistance properties.

* * * * *